United States Patent [19]

Blum et al.

[11] Patent Number: 4,802,062

[45] Date of Patent: Jan. 31, 1989

[54] INTEGRATED WIRING SYSTEM FOR VLSI

[75] Inventors: Arnold Blum, Gechingen; Marian Briska, Rottenburg; Knut Najmann, Gartringen, all of Fed. Rep. of Germany

[73] Assignee: International Business Machines Corp., Armonk, N.Y.

[21] Appl. No.: 70,265

[22] Filed: Jul. 6, 1987

[30] Foreign Application Priority Data

Aug. 22, 1986 [EP] European Pat. Off. ........ 86111642.4

[51] Int. Cl.$^4$ .............................................. H05K 1/18
[52] U.S. Cl. .................................... 361/401; 361/407; 361/412; 361/414
[58] Field of Search ............... 361/401, 407, 412, 413, 361/414

[56] References Cited

U.S. PATENT DOCUMENTS

| | | | |
|---|---|---|---|
| 3,777,221 | 12/1973 | Tatsuko et al. | 361/401 |
| 4,074,342 | 2/1978 | Honn et al. | 361/411 |
| 4,288,841 | 9/1981 | Gogal | 361/401 X |
| 4,328,530 | 5/1982 | Bajorek | 361/401 X |
| 4,445,112 | 4/1984 | Haville | 361/413 X |
| 4,598,308 | 7/1986 | James et al. | 361/401 X |
| 4,598,337 | 7/1986 | Wutrich et al. | 361/401 |
| 4,645,943 | 2/1987 | Smith et al. | 361/401 X |
| 4,653,822 | 3/1987 | Kanazawa | 361/401 X |
| 4,688,151 | 8/1987 | Kraus et al. | 361/407 X |
| 4,705,917 | 11/1987 | Gates et al. | 361/401 X |

OTHER PUBLICATIONS

A. Truchi, Two-Level Printed Circuit Board, IBM. Tech. Disc. Bull., vol. 14 #11, Apr. 1972, p. 3482 relied on.

Primary Examiner—R. R. Kucia
Attorney, Agent, or Firm—Steven J. Meyers; Yen S. Yee

[57] ABSTRACT

An integrated (silicon based) packaging/wiring structure provides for VLSI chips 4 to be placed within openings of somewhat larger size in a semiconductor interconnection wafer (IW, 2) supported by a carrier 1. The interconnection wafer 2 includes multilevel (ML) wiring planes and incorporated circuit components integrated in a less demanding technology as compared to the VLSI chips 4. Silicon contact chips 5 with conductive surface layers 22, 23 placed over the chip/IW plane provide for the required interconnections by means of needle-like structures 24 inserted in corresponding via holes. The needles are better suited to withstand shear strain than are conventional C-4 (Controlled Collapse Chip Connection) joints. Consequently a much higher number of chip pads can be provided. Power supply is effected via rather large-dimensioned conductive planes, e.g. in the form of Cu rails 20, running within the carrier 1 and surfacing stud-like (at 21) in the peripheral region of said openings in the interconnection wafer 2 for further distribution via the contact chip 5. The wiring system can be supplemented, if required, with an additional wiring wafer 6.

40 Claims, 6 Drawing Sheets

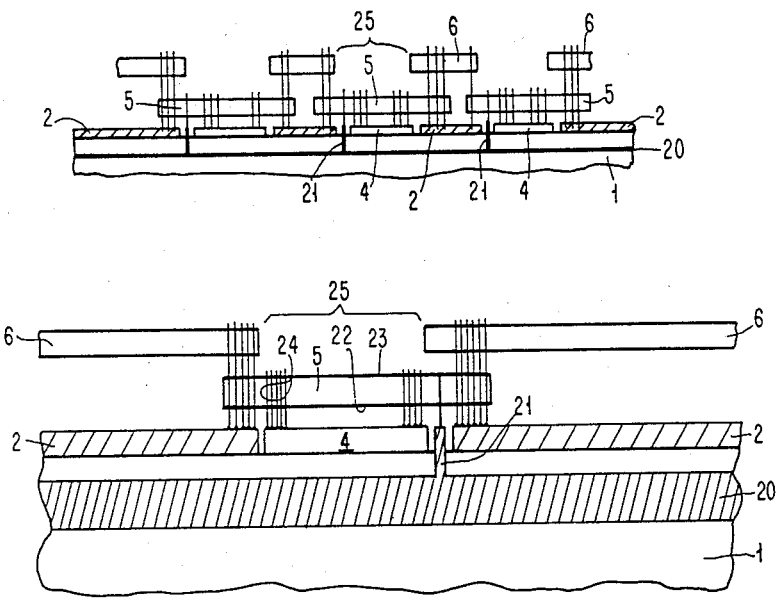
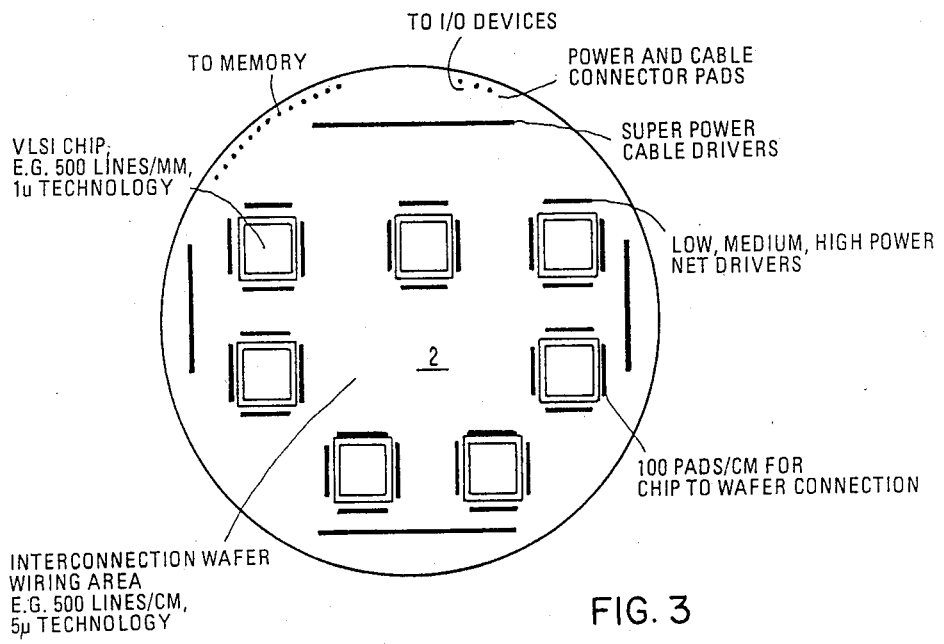
FIG. 2
FIG. 3

INTEGRATED WIRING SYSTEM FOR VLSI

FIELD OF THE INVENTION

This invention relates generally to the field of integrated circuit chip packaging and more particularly to a VLSI (very large scale integration) packaging concept using base substrates of semiconductor material for superior chip or component interconnection.

BACKGROUND

Regarding the ongoing remarkable advances made in integrated circuit (IC) technology over the past years, the package for the VLSI circuits seems to be becoming more of a problem than the VLSI chips themselves. In other words, packaging—the technology of protection, connecting, cooling and housing the circuits—appears to presently be the main limitation on (inter alia) the speed and performance of complex electronic systems built with IC's. The prior art is replete of "ideal" design approaches to each packaging goal but they frequently conflict so that compromises are required for any "practical" system packaging design. In this rather complex field—where electrical, mechanical and metallurgical aspects have to be carefully considered—finding the "right" balanced compromise is often decisive for the success or failure of a particular approach.

From the viewpoint of this invention the following references are regarded representative of the prior art.

(a) Silicon-on-Silicon Packaging Structures

IBM Technical Disclosure Bulletin (TDB), Vol. 19, No. 9, February 1977, pp. 3321–3322, "Modular Organic Carrier"

IBM TDB, Vol. 15, No. 2, July 1972, pp. 656–657, "Active Silicon Chip Carrier"

IBM TDB, Vol. 17, No. 7, December 1974, p. 2018, "Integrated Circuit Chip Package"

U.S. Pat. No. 4,458,297 to Stopper et al., "Universal Interconnection Substrate"

(b) Wiring/Contacts

IBM TDB, Vol. 17, No. 8, January 1975, pp. 2260-2260A, "Power and Signal Structure for an Integrated Wafer Package"

IBM TDB, Vol. 22, No. 8A, January 1980, pp. 3406–3409, "Fabrication of Multiple LSI Silicon Chip Modules"

U.S. Pat. No. 4,545,610 to Lakritz et al., "Method for Forming Elongated Solder Connections Between A Semiconductor Device and A Supporting Substrate"

IBM U.S. application Ser. No. 702,199 (Feb. 15, 1986) "Solder Connection Between Microelectronic Chip and Substrate and Method of Manufacture"(IBM Docket No. FI9-84-045)

(c) Silicon Micro-machining

K. E. Petersen, "Silicon as a Mechanical Material", Proc. IEEE, Vol. 70, No. 5, May 1982, pp. 420ff, espec. 435, 436 (coolers)

IBM TDB, Vol. 19, No. 2, July 1976, pp. 460–461, "Integrated Circuit Chip Cooling"

Beside these approaches towards the superior packaging of VLSI chips, a more system-oriented concept was pursued which is referred to as "wafer-scale integration" or the "full wafer" approach. This was pursued in the microcomputer field for instance. The problems of long off-chip net delays and relatively small numbers of chip pads were addressed by placing (partitioning) an entire functional unit (e.g. central processor) on a single VLSI chip. In practical development work, however, this full wafer approach has failed to prove feasible due to unacceptably low yield figures, as well as unacceptable redundant requirements.

Thus, despite the progress in today's VLSI on-chip switching speeds and despite the great many proposals made in the packaging field, there is still an urgent need for a VLSI packaging system which provides for significantly reduced off-chip net delays as well as for largely increased chip pad numbers relative to the number of circuits on the VLSI chips. Further, such a packaging system should provide for superior power distribution/supply to the chips to facilitate managing the so-called $\Delta I$ effect (e.g. from the simultaneous switching of hundreds of drivers). Finally the packaging system should result in a rather small overall package allowing advanced low temperature (e.g. liquid nitrogen) cooling techniques to be applied if desired.

SUMMARY

The invention as claimed provides a solution to the above problems. Briefly, the proposed integrated silicon based packaging/wiring concept provides for the VLSI chips to be placed within corresponding openings of somewhat larger size in a silicon interconnection wafer (IW) supported by a carrier structure. The interconnection wafer bears multilevel (ML) wiring planes and has incorporated circuit components integrated in a less demanding thin film technology, say, in 5 μm technology, as compared to, say, in 1 μm technology of the VLSI chips. Silicon contact chips (CC) with conductive surface layers placed over the chip/IW plane provide the required contacts or interconnections by means of needle-like structures inserted in corresponding via holes, which needles are better suited as to shear strain problems otherwise encountered with conventional C-4 (Controlled Collapse Chip Connection) joints; consequently a much higher number of chip pads can be allowed, with almost no restrictions as to where they have to be located. Power is supplied via rather large-dimensioned conductive planes, e.g. in the form of Cu rails, running within the carrier and surfacing stud-like in the peripheral region of openings in the interconnection wafer for further distribution via the contact chip. All components of this wiring system are laid out taking advantage of modern silicon (generally semiconductor) micro-machining methods resulting in a superior VLSI packaging concept.

BRIEF DESCRIPTION OF THE DRAWINGS

The invention is described in more detail below with reference to drawings which illustrate only specific embodiments.

FIG. 2 shows partial cross-sections in normal and enlarged scale of the in-place packaging parts specifically focusing on the wiring and interconnection system.

FIG. 3 is a plan view of an interconnection wafer illustrating various types of circuitry provided in or on this level of packaging.

FIGS. 11A and 11B indicate very schematically a preferred way to form the via pattern in, for instance, a contact chip or the like.

DESCRIPTION OF THE PREFERRED EMBODIMENTS

Regarding the following description of preferred embodiments of the invention it should be noted that the drawings do not give true dimensions nor are they to scale. Further, the mentioning of any specific IC technology or conductivity type in connection with the VLSI chips or the interconnection wafer is to be understood merely as an example without excluding the usual alternatives.

Figure 1:
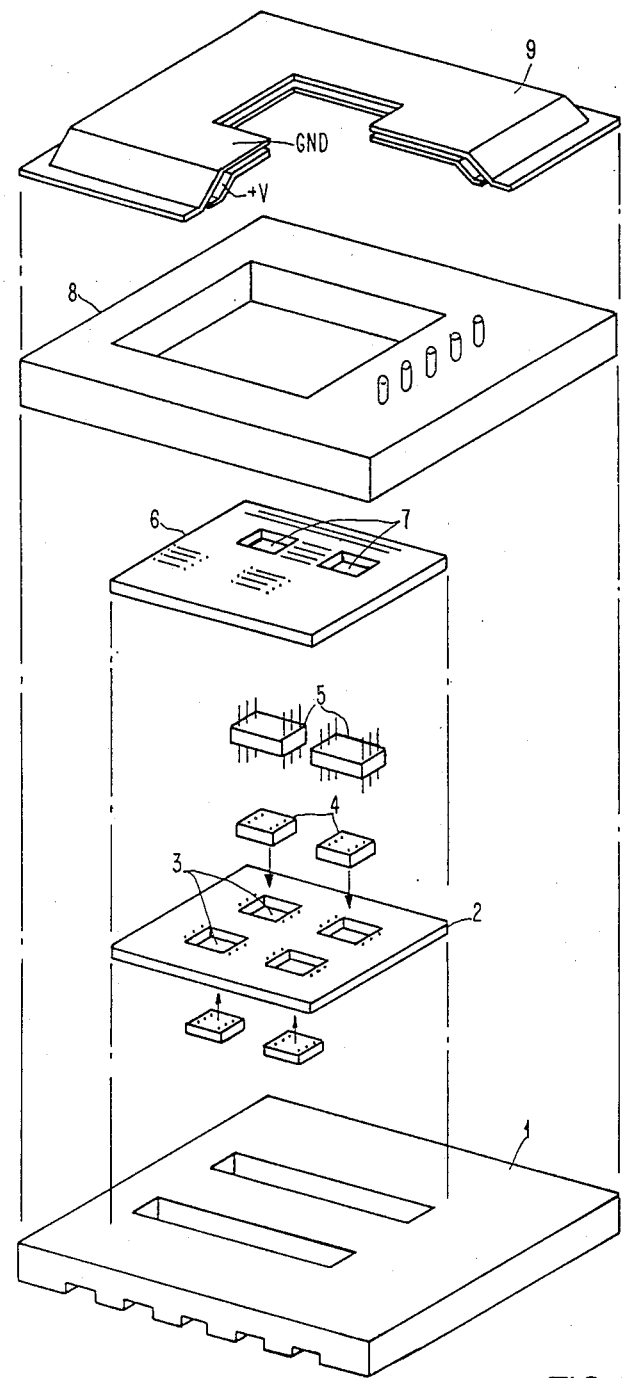
FIG. 1 shows in an exploded view major parts of the proposed packaging system and indicates the relative position of those parts in a final assembly.

Referring to FIG. 1, the major elements of the proposed package are illustrated in a rather simplified exploded view to facilitate overall understanding of the relative part positions and the resulting package assembly. Onto carrier 1 there is attached interconnection wafer 2 (also referred to as IW) with openings 3 into which VLSI chips 4 are placed "backside down", i.e. the "active" side is up. Both IW 2 and VLSI chips 4 are eventually held in intimate contact with carrier 1 for efficient heat transfer which is generally indicated by the cooling fins. The slots shown in the carrier substrate 1 are for the buried power supply rails (not shown in FIG. 1) to surface; this is described in greater detail below with reference to FIGS. 2, 5 and 7. Interconnection between the VLSI chips and the IW is made by means of special contact chips 5 which have formed on their surfaces power and signal wiring levels and which are equipped with needle-like contacts inserted through corresponding vias; again a more detailed description is given with reference to FIGS. 2, 6B, 8 and 9. If desired, another wiring level may be added in the form of a high performance wiring wafer (HPWW) 6 which is described in greater detail with reference to FIGS. 2 and 10. The HPWW is adapted to perform fast communication between the VLSI chips. Openings 7 may be provided in the HPWW 6 at the location of the VLSI chips for testing and repair purposes.

Regarding the material selection, the following applies. The IW 2, like the VLSI chips 4, consists of semiconductor material suitable for integrated circuit manufacturing. Preferably, this will be silicon; but it may be also advantageous to have some of the VLSI chips along a critical timing path under system aspects formed as, for instance, fast GaAs IC's, thus the IW 2 may be other semiconductor materials such as GaAs. The contact chips 5 as well as the HPWW 6 (if any) and preferably the carrier 1 should be of a material which allows application of the semiconductor micro-machining methods which have become quite attractive for achieving extraordinary small and precise mechanical microstructures and for which reference is made to the prior art listed in section (c) above. In the following description of embodiments of the proposed packaging and wiring system, an "all-silicon" approach is taken as example, it should be noted, however, that silicon is but one material selection and may be exchanged accordingly. The carrier material may be also selected from other material groups such as copper, silicon carbide, ceramic or the like depending upon the specific emphasis placed on a particular function, for instance, minimum thermal mismatch relative to the IW or maximum cooling capacity or electrical conductivity; for the latter an example is described below with reference to FIG. 5.

The wiring package described so far may be completed by attaching it to a conventional MLC (multilayer ceramic) frame 8 with I/0 pins and finally providing a sealing cover, for instance, by twin cap 9 with external power connections by an outer ground (GND) cap and an inner supply voltage cap, e.g. for +V.

FIG. 2 shows in greater detail sectional views through the proposed packaging and wiring system which, in addition to FIG. 1, are to aid in understanding of the packaging configuration.

Carrier 1 contains the low-ohmic buried power supply line system indicated by power rails 20 which extend to the surface as studs 21 at the periphery of the opening in the IW 2 for accommodation of the VLSI chips 4. For the required interconnections between the various circuitry parts, e.g. the VLSI chips 4 and the IW 2, specific contact chips (CC) 5 are provided in a wiring plane overlying the IW level. The surfaces of contact chips 5 are covered with conductive layers 22 and 23 serving as, for instance, power and signal distribution planes, respectively, and working in connection with corresponding contact needles 24. If required, an additional wiring level may be provided by means of the HPWW 6 (mentioned earlier) which is structured similar to the CC 5. From FIG. 2 it can further be seen that the provision of openings 25 in HPWW 6 allows for elegant in-place testability of chips 4 since contact needles 24 "extend" the chip pads to the upper surface of CC 5 so that they become "externally" accessible.

Figure 4:
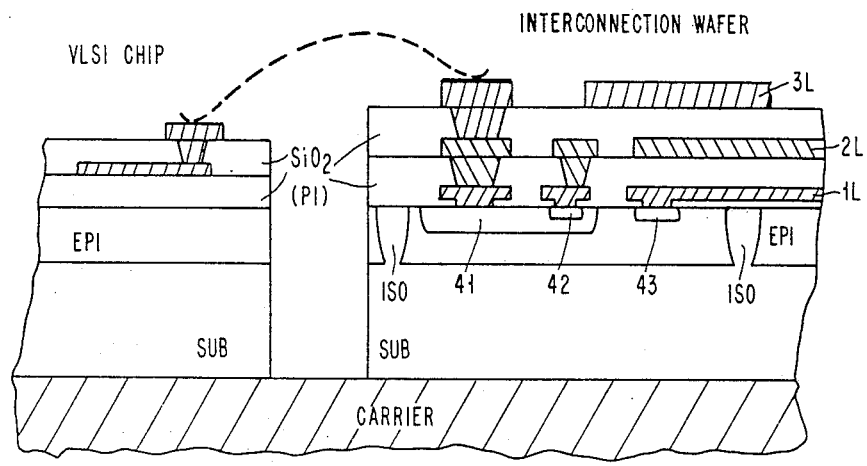
FIG. 4 is a sectional view through parts of the VLSI chip and the interconnection wafer to indicate a typical layer sequence.

FIG. 3 is a schematic representation of interconnection wafer IW 2 with specific emphasis given to the type of incorporated circuit and wiring elements. In conventional technology there is a multilayer wiring metallurgy deposited on the wafer substrate for the chip interconnections. The wafer itself has incorporated integrated circuit elements, e.g. transistors, resistors, etc. which preferably form driver circuit functions. FIG. 4 gives an example of a typical structure cross-section from which it is apparent that IW 2 and VLSI chip 4 have in common that they both are integrated circuit structures, but with certain modifications. A specifically important feature of the proposed wiring system is that the IW 2 takes advantage of the substantially higher yield when allowing a less aggressive or demanding integration technology for its (driver) circuit and other wiring elements. As representative of this feature one can, for instance, qualify a technology by its (minimum) line width capability. Thus while the (discrete) VLSI chips may use the best available technology, say 1 $\mu$m or smaller, with a correspondingly moderate yield, the interconnection wafer allows for a much higher yield (over a larger semiconductor surface area) by applying a much less aggressive, say, 5 $\mu$m technology with correspondingly relaxed ground rule definitions.

The basic idea of this type of IW is that the chip outputs are normally not directly connected to the wiring lines on the IW but they lead first to the inputs of corresponding line drivers before being further distributed. Regarding further details as to different types of driver stages, technology parameters, etc. reference is made expressively to FIG. 3.

While the interconnection wafer of FIG. 3 is shown as a full circular shaped wafer, this is, of course, not necessary in all cases. FIG. 1, for instance, shows as another example a rectangular IW form. Further shapes for the IW 2 are also possible depending on specific application contexts, e.g. a cross-like IW structure, etc.

As already briefly mentioned above, FIG. 4 is to illustrate what the internal layer structure of the interconnection wafer and a VLSI chip could be. The embodiment of FIG. 4 would be typical for a bipolar technology. Both the VLSI chip and the IW have an epitaxial layer (EPI) formed on a monocrystalline silicon (generally semiconductor) substrate. In the epitaxial layer there are formed in conventional manner the required integrated circuit elements, for instance, in the IW a transistor driver stage with 41, 42 and 43 representing the base, emitter and collector (contact) regions of the specific conductivity types required. The isolation (ISO) may be of any conventional type such as electric, dielectric or a combination of both. In the example shown the IW has provided three conductive layers (1L, 2L, 3L) for the wiring whereas the VLSI chip has two of those. The wiring layers are separated by a suitable dielectric such as $SiO_2$, $Si_3N_4$, polyimide (PI) or combinations thereof. Indicated by an interrupted line is a wiring interconnection between a pad of the VLSI chip 4 and the interconnection wafer 2. A preferred implementation of the interconnection is in the form of the contact chip. Of course other (than bipolar) technologies can be used for processing the VLSI chip(s) 4 and the IW 2, for instance, MOS/-CMOS etc. and it is not required that the VLSI chips and the IW are of the same technology type.

Figure 7:
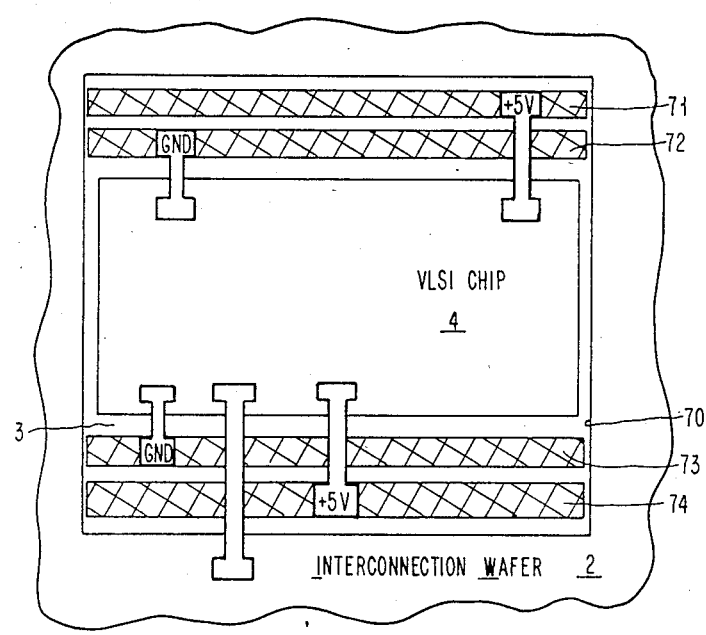
FIG. 7 is a plan view illustrating various types of (power supply) connections to the VLSI chip and the interconnection wafer.
Figure 5:
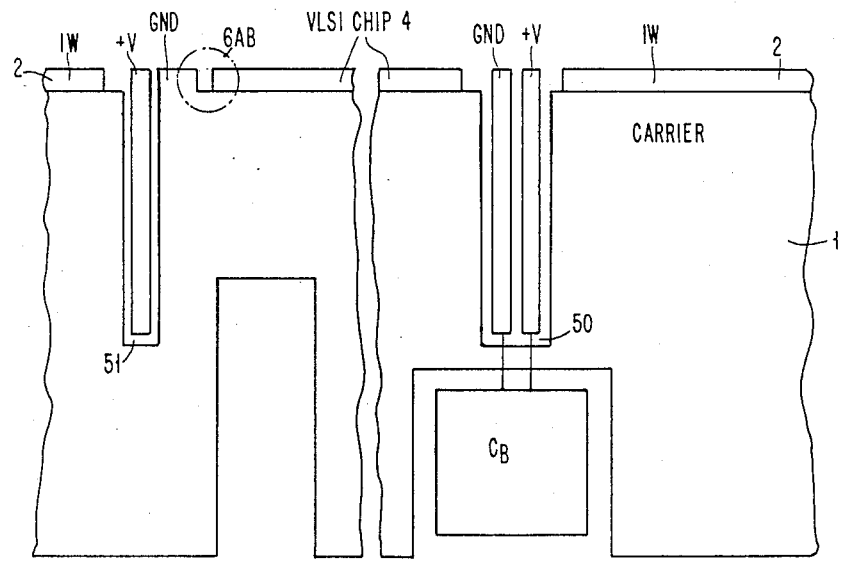
FIGS. 5 and 6A and 6B are cross-sections of the carrier supporting the interconnection wafer and the VLSI chips with specific focus on the power supply/distribution features.

With additional reference to FIGS. 5, 6 and 7 the power supply system is described in greater detail. In particular it is shown how the carrier substrate 1, besides supporting interconnection wafer IW 2 and VLSI chip 4, is used to house the buried power planes or power rails for, say, GND and +V. Shown in the right hand part of FIG. 5 there are two separate power rails (GND and +V) provided in a corresponding recess or slot 50 in carrier 1. In case of a highly conductive carrier, e.g. made of copper, it may be advantageous to use the carrier for supplying the GND potential so that merely one power rail (for +V) needs to be provided in a correspondingly smaller slot 51 as is indicated in the left part of FIG. 5.

It is important to note that by this construction it is possible to provide the power planes with rather large dimensions thus ensuring a low-ohmic power supply and distribution with an accordingly reduced I effect as compared to conventional power supply lines of smaller size. To give an example, the cross section of the power rails in FIG. 5 can be as large as 5 mm (height) by 0.5 mm (width). The power rails are isolated against each other or against the substrate which can be done by a variety of conventional ways such as embedding them in suitable dielectric material, etc. Further, additional decoupling capacitors may be provided, (if required) as illustrated generally by $C_B$.

Figure 6A:
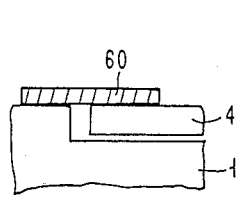
Figure 6B:
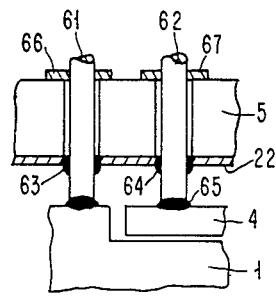

For actually providing the required power supply connections to the VLSI chips 4 and/or the interconnection wafer 2 the buried power rails preferably protrude from the carrier 1 up to the level of the chip and/or IW surface. Connection can thus be made between pads in the same (height) level. FIGS. 6A, 6B show, in enlarged form, examples for such a connection for the detail area indicated with 6AB in FIG. 5. While suitable connections may be made in a great variety of conventional ways, e.g. by wire or flex tab bonds 60 FIG. 6A the preferred way is that illustrated in FIG. 6B, i.e. by means of a contact chip 5 (already mentioned above) having inserted contact needles 61 and 62. The example shows a connection between carrier 1 and the VLSI chip 4. Contact needle 61 contacts (a pad on, not shown) carrier 1; via the solder joint 63 to metal layer 22 and solder joint 64 connection is made to contact needle 62 and to chip pad 65. As will be described in more detail below with reference to FIGS. 8 and 9 solder rings 66 and 67 on the upper surface of contact chip 5 are isolated from the remaining layer on that surface.

While FIGS. 6A and 6B show connections established between the carrier substrate 1 and a chip 4 this is, of course, for illustration purposes only. Other interconnections can be provided in the same manner. In a plan view, FIG. 7 gives a rather schematic survey of some interconnections provided between VLSI chip 4 placed in opening 3 (periphery 70) of IW 2 together with power rails 71, 72, 73 and 74. It is to be understood that these interconnections are most preferably made by means of a contact chip which has been shown in earlier FIGS. 1, 2, 5 and 6B and which will be described in some more detail below.

Figure 8A:
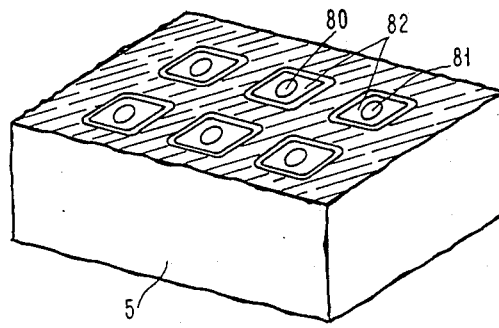
FIGS. 8A, 8B and 9 are to illustrate the structure and function of the contact chip.
Figure 8B:
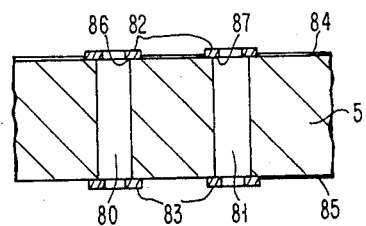
Figure 9:
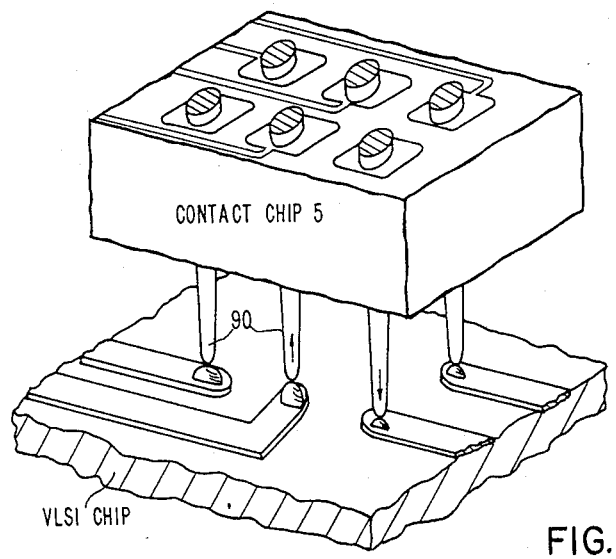

FIGS. 8A and 8B show in diagrammatical and cross-sectional view the body of a contact chip 5; FIG. 9 is to illustrate how the contact chip 5 establishes the desired connections between corresponding chip and/or wiring wafer pads. Contact chip 5 has formed in its body via holes, e.g. 80, 81 in FIG. 8B, with a typical diameter of about 100 μm. Rings 82 and 83 of a solder material are provided around the periphery of via holes 80, 81 on the top and bottom surface of contact chip 5. Solder rings 82 and 83 are preferably formed by conventional evaporation of PbSn with a thickness of about 20 to 50 μm. Depending upon the specific connection required, these solder rings are physically connected to the remaining interconnection pattern formed in that particular surface wiring level, i.e. in the signal distribution plane 84 or in the power distribution plane 85. These wiring planes may be of conventional Al-Cu or other suitable material of good electrical conductivity. For the signal distribution plane 84 (on upper surface of contact chip 5) this is shown in FIG. 9. The openings in solder rings (i.e. 82, 83) are of a smaller dimension compared to the diameter of the associated via holes 80 and 81 so that there exist PbSn overhangs indicated, for instance in FIG. 8B as 86 and 87.

For establishing the actual contacts to the circuit or wiring pads to be connected, contact needles 90 are inserted into the via holes of contact chip 5. Suitable materials for the contact needles may include V2A steel, tungsten, etc. being coated with (electroless) solder material such as PbSn. The final arrangement may best be understood with further reference to FIG. 9. When inserted, contact needles 90 are held by means of the two "soft" solder rings per via hole, such as rings 82 and 83 of via hole 80 in FIG. 8B. To a certain extent, however, contact needles 90 allow for an adjustment in their vertical direction so that reliable contacts are made even to pads of varying heights. FIG. 9 illustrates this adjustment capability for different chip pad elevations by corresponding arrows. Compared to FIG. 8A the representation of FIG. 9 is further completed with regard to the interconnections made between (some of) the contact needles 90 and the (signal) wiring pattern 84 on the (upper) surface shown. Needles which are not connected in this upper surface of contact chip 5 are connected to the (power) wiring plane on the bottom surface (not shown) of contact chip 5. A preferred way of forming the contact chip body with its precise hole pattern is described below with reference to FIG. 11.

Figure 10:
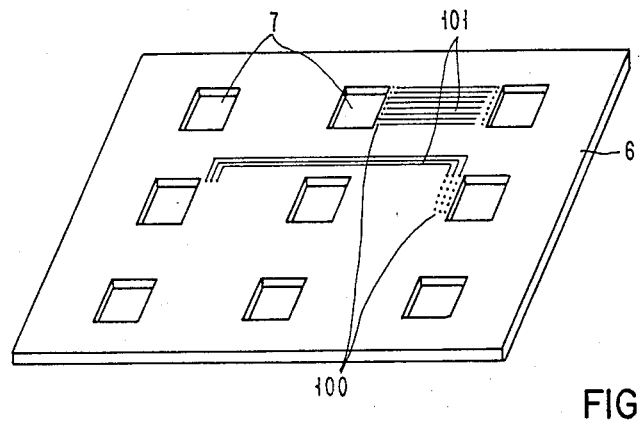
FIG. 10 is to illustrate an optional wiring level in the form of an additional high performance wiring wafer.

FIG. 10 shows again the aforementioned high performance wiring wafer (HPWW) 6 which may be added to the proposed wiring scheme, if there is a need for additional low-ohmic and low-capacitance interconnection facilities. Besides openings 7, reference 100 indicates groups of holes with contact needles of the type described above. These needles reach down to corresponding pads on the interconnection wafer (referred to as 2 in earlier FIGS. 1 and 2) and may be selectively connected on this HPWW packaging level to the respective wiring pattern. The wiring planes of the HPWW 6 are preferably organized as, for instance, an X-wiring plane on the upper surface shown in FIG. 10 and a Y-wiring plane on its bottom surface. Indicated as 101 in FIG. 10 is a group of rather "large" (about 100 $\mu$m) conductive lines running in the X-direction and being connected to corresponding contact needles in the same way as shown earlier for the contact chip.

The described wiring scheme allows for optimum interconnection of VLSI chips in a VLSI packaging system. In particular, it allows for consideration of different interconnection lengths as well as loads due to different fan-in and/or fan-out figures. For instance, connecting an output of a first VLSI chip via a single line to an input of another chip may be done best via the interconnection wafer level. However, if several chip inputs are to be coupled to one output on another chip or if a rather long interconnection is to be provided, then going via the HPWW may be the preferable way.

A typical hierarchy order with regard to the corresponding line width used in the proposed wiring system may be as follows:

| VLSI chip | 1 $\mu$m |
| IW, CC | 10 $\mu$m |
| HPWW | 100 $\mu$m |
| MLC | 1000 $\mu$m |

Finally, additional wiring structures of the described type (e.g. HPWW) may be provided when needed. The resulting packaging further allows for accommodation of VLSI chips of different circuit and technology type such as MOS/CMOS/ECL/GaAs etc.

This method of Al thermomigration is believed known for making vertical PN junctions (i.e., dopping), -extension by subsequent etching doped channels to form vias may be novel.

Figure 11A:
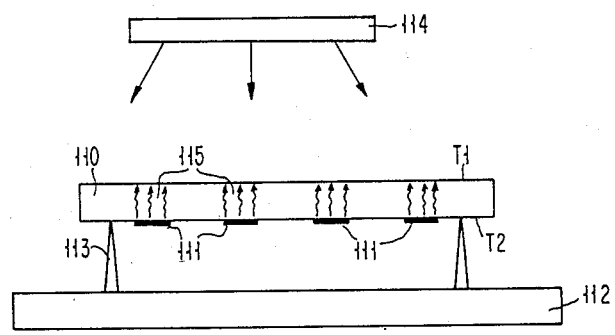

With reference to FIG. 11A, a preferred way is described to form a very precise via hole pattern in the contact chip and high performance wiring wafer to the required quality.

Figure 11B:
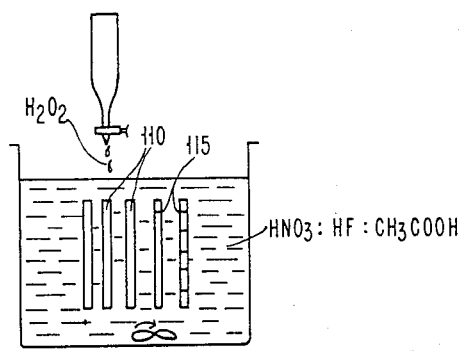

Silicon wafer 110 of a <100> crystal orientation and having metal (i.e. preferably Al) dots 111 (with a typical diameter of 100 $\mu$m and a thickness of 20 to 30 $\mu$m) evaporated onto one of its surfaces is placed over water cooled plate 112 by means of quartz spacers 113. Infrared lamps 114 may be used to heat wafer 110 to a temperature T1 of about 1150° C. Thereby a temperature gradient of about 200° C./cm is generated between the two wafer surfaces. To give an example with T1 of 1150° C., T2 will be about 1140° C. As a result, Al dots 111 migrate to the higher temperature surface (indicated by arrows) and thus form a P+ doping channel or column indicated by reference numeral 115, the doping concentration being typically about $2 \times 10^{19}$ al atoms/cm$^3$. The time duration of this thermomigration is only about 5 minutes. Subsequently, the wafers are etched as shown in FIG. 11B in a solution comprising (in a part ratio of 1:3:8):

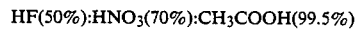

HF(50%):HNO$_3$(70%):CH$_3$COOH(99.5%)

During this etch process the solution is intensively agitated and H$_2$O$_2$ is added dropwise as indicated. As a result the Al migrated columns 115 of P+ doping are etched with an etching rate of about 3 $\mu$m/min. while the remaining N- doped silicon of wafer 110 is etched with a much lower rate of less than 0.02 $\mu$m/min. To avoid the generation of HNO$_2$, it may be advantageous to cover the wafer surface with a resist mask leaving just the Al dots 110 exposed. While the above method is preferred, other methods may be applied as well such as micro-drilling techniques by ultrasonic punching, laser or particle beam technologies.

What is claimed is:

1. Integrated wiring system for at least one circuit chip comprising:
   a carrier structure including buried power supply rails;
   a semiconductor interconnection wafer positioned above said carrier structure and having multilevel wiring planes and openings having at least one circuit chip located therein;
   said buried power supply rails having portions protruding from said carrier structure up to the level of said at least one circuit chip and said interconnection wafer;
   at least one contact chip positioned above each said at least one circuit chip lying in the interconnection wafer plane, each said at least one contact chip having conductive surface layers providing electrical interconnections between each said at least one circuit chip and between at least one circuit chip and the interconnection wafer by means of contact needles extending through each said at least one contact chip.

2. The wiring system as in claim 1 further comprising a high performance wiring wafer provided over the plane containing the contact chips, said high performance wiring wafer providing low-ohmic, low-capacitance interconnections compared to interconnections on said interconnection wafer.

3. The wiring system of claim 1 wherein the material of said interconnection wafer and said contact chips is silicon.

4. The wiring system of claim 1 wherein said interconnection wafer is provided with drivers.

5. The wiring system of claim 2 wherein said interconnection wafer is provided with drivers.

6. The wiring system of claim 3 wherein said interconnection wafer is provided with drivers.

7. The wiring system of claim 4 wherein said drivers are located in the vicinity of said openings in said interconnection wafer.

8. The wiring system of claim 5 wherein said drivers are located in the vicinity of said openings in said interconnection wafer.

9. The wafer system of claim 6 wherein said drivers are located in the vicinity of said openings in said interconnection wafer.

10. The wiring system of claim 1 wherein the line width of metallization on said circuit chips is approximately a factor of 10 less than the line width of metallization on said interconnection wafer and the contact chips.

11. The wiring system of claim 2 wherein the line width of metallization on said chips is approximately a factor of 10 less than the line width of metallization on said interconnection wafer and contact chips, which are approximately a factor of 10 less than the line width of metallization on said high performance wiring wafer.

12. The wiring system of claim 1 wherein said contact chips are provided with solder rings on their surface at the periphery of corresponding via holes, said solder rings adapted to selectively establish contact between that wiring plane and the contact needle in a particular via hole.

13. The wiring system of claim 3 wherein said contact chips are provided with solder rings on their surface at the periphery of corresponding via holes, said solder rings adapted to selectively establish contact between that wiring plane and the contact needle in a particular via hole.

14. The wiring system of claim 12 wherein the opening in said solder rings is smaller than the via hole diameter, thus providing an overhang for holding a contact needle inserted in a via hole in a position allowing to adjust for different contact pad heights on the underlying wiring level.

15. The wiring system of claim 13 wherein the opening in said solder rings is smaller than the via hole diameter, thus providing an overhang for holding a contact needle inserted in a via hole in a position allowing to adjust for different contact pad heights on the underlying wiring level.

16. The wiring system of claim 1 wherein the contact needles of a contact chip are of a shear strain absorbing material being coated with a solder material.

17. The wiring system of claim 2 wherein the contact needles of a contact chip are of a shear strain absorbing material being coated with a solder material.

18. The wiring system of claim 3 wherein the contact needles of a contact chip are of a shear strain absorbing material being coated with a solder material.

19. The wiring system of claim 2 wherein said high performance wiring wafer is provided with openings in areas of underlying contact chips.

20. The wiring system of claim 3 wherein said high performance wiring wafer is provided with openings in areas of underlying contact chips.

21. The wiring system of claim 4 wherein said high performance wiring wafer is provided with openings in areas of underlying contact chips.

22. The wiring system of claim 12 wherein said high performance wiring wafer is provided with openings in areas of underlying contact chips.

23. The wiring system of claim 2 wherein said high performance wiring wafer is provided with metal wiring layers on its surfaces being organized to form interconnection substantially in X- and Y-direction.

24. The wiring system of claim 3 wherein said high performance wiring wafer is provided with metal wiring layers on its surfaces being organized to form interconnection substantially in X- and Y-direction.

25. The wiring system of claim 4 wherein said high performance wiring wafer is provided with metal wiring layers on its surfaces being organized to form interconnection substantially in X- and Y-direction.

26. The wiring system of claim 12 wherein said high performance wiring wafer is provided with metal wiring layers on its surfaces being organized to form interconnection substantially in X- and Y-direction.

27. The wiring system of claim 19 wherein said high performance wiring wafer is provided with metal wiring layers on its surfaces being organized to form interconnection substantially in X- and Y-direction.

28. The wiring system of claim 1 wherein said carrier structure is provided with slots adapted for accommodation of said power supply rails, which rails are formed to extend from the carrier body to the surface to allow for contacts to be made to said power rails.

29. The wiring system of claim 2 wherein said carrier structure is provided with slots adapted for accommodation of said power supply rails, which rails are formed to extend from the carrier body to the surface to allow for contacts to be made to said power rails.

30. The wiring system of claim 3 wherein said carrier structure is provided with slots adapted for accommodation of said power supply rails, which rails are formed to extend from the carrier body to the surface to allow for contacts to be made to said power rails.

31. The wiring system of claim 1 wherein said carrier structure is adapted to act as a power plane for one of the supply voltages.

32. The wiring system of claim 28 wherein said carrier structure is adapted to act as a power plane for one of the supply voltages.

33. The wiring system of claim 29 wherein said carrier structure is adapted to act as a power plane for one of the supply voltages.

34. The wiring system of claim 30 wherein said carrier structure is adapted to act as a power plane for one of the supply voltages.

35. The wiring system of claim 1 further comprising a mounting frame of a multilayer ceramic, which is adapted to accommodate the integrated wiring system and to provide for its external electrical accessibility.

36. The wiring system of claim 2 further comprising a mounting frame of a multilayer ceramic, which is adapted to accommodate the integrated wiring system and to provide for its external electrical accessibility.

37. The wiring system of claim 3 further comprising a mounting frame of a multilayer ceramic, which is adapted to accommodate the integrated wiring system and to provide for its external electrical accessibility.

38. The wiring system of claim 4 further comprising a mounting frame of a multilayer ceramic, which is adapted to accommodate the integrated wiring system and to provide for its external electrical accessibility.

39. The wiring system of claim 1 further comprising a cap for protection and external supply connection to the package.

40. The wiring system of claim 35 further comprising a cap for protection and external supply connection to the package.

* * * * *